United States Patent
Sato et al.

(10) Patent No.: US 12,532,765 B2
(45) Date of Patent: Jan. 20, 2026

(54) THREE-PHASE MOTOR DRIVER WITH BUILT-IN DISCRETE MOSFETS

(71) Applicant: Renesas Electronics America Inc., Milpitas, CA (US)

(72) Inventors: Tetsuo Sato, San Jose, CA (US); Jianghong Ding, Ladera Ranch, CA (US); Yonggoo Eom, Danville, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 498 days.

(21) Appl. No.: 18/187,300

(22) Filed: Mar. 21, 2023

(65) Prior Publication Data
US 2024/0321824 A1    Sep. 26, 2024

(51) Int. Cl.
*H01L 23/00* (2006.01)
*H03K 17/687* (2006.01)
*H10D 84/83* (2025.01)

(52) U.S. Cl.
CPC .............. *H01L 24/85* (2013.01); *H01L 24/45* (2013.01); *H03K 17/6871* (2013.01); *H03K 17/6877* (2013.01); *H10D 84/83* (2025.01); *H01L 2924/1426* (2013.01); *H03K 2217/0063* (2013.01)

(58) Field of Classification Search
CPC ........... H01L 24/48; H01L 24/49; H02P 29/00
See application file for complete search history.

(56) References Cited

FOREIGN PATENT DOCUMENTS

| JP | H08125116 A | * | 5/1996 | ............. H01L 24/06 |
| JP | 2007074831 A | * | 3/2007 | |
| WO | WO-9745957 A1 | * | 12/1997 | ........... H03K 17/122 |

\* cited by examiner

*Primary Examiner* — William B Partridge
*Assistant Examiner* — Felix B Andrews
(74) *Attorney, Agent, or Firm* — SCULLY, SCOTT, MURPHY & PRESSER, P.C.

(57) ABSTRACT

Circuits and devices for a motor driver are described. A hybrid integrated circuit (IC) can include a driver IC, a first IC, and a plurality of second ICs. The first IC can include a plurality of high-side metal-oxide-semiconductor field-effect transistors (MOSFETs). The first IC can further include a common drain terminal connected to drains of the plurality of high-side MOSFETs. Each one of the plurality of second ICs can include a respective low-side MOSFET. The hybrid IC can further include a first set of bonding wires connecting the driver IC to the first IC. The hybrid IC can further include a second set of bonding wires connecting the driver IC to the plurality of second ICs. The hybrid IC can further include a third set of bonding wires connecting the first IC to the plurality of second ICs.

20 Claims, 8 Drawing Sheets

THREE-PHASE MOTOR DRIVER WITH BUILT-IN DISCRETE MOSFETS

BACKGROUND OF THE SPECIFICATION

The present disclosure relates in general to semiconductor devices. More specifically, the present disclosure relates to a three-phase motor driver with built-in discrete metal-oxide-semiconductor field-effect transistors (MOSEFTs).

Driver integrated circuits (ICs) can drive multiple transistors. Wires can be used for connecting the driver IC to the transistors. The wires can contribute to drain-source on resistance (RDSON) of the transistors. As the distance between the driver IC and the transistor increases, longer wires may be needed and impedance of the longer wires can contribute to an increase of RDSON of the transistors.

SUMMARY

In one embodiment, a hybrid integrated circuit (IC) implementing a motor driver is generally described. The hybrid IC can include a driver IC, a first IC, and a plurality of second ICs. The first IC can be arranged along one side of the driver IC in plan view. The first IC can include a plurality of high-side metal-oxide-semiconductor field-effect transistors (MOSFETs). The first IC can further include a common drain terminal connected to drains of the plurality of high-side MOSFETs. Each one of the plurality of second ICs can include a respective low-side MOSFET. The hybrid IC can further include a first set of bonding wires connecting the driver IC to the first IC. The hybrid IC can further include a second set of bonding wires connecting the driver IC to the plurality of second ICs. The hybrid IC can further include a third set of bonding wires connecting the first IC to the plurality of second ICs. Each one of the plurality of high-side MOSFETs and low-side MOSFETs among the plurality of second ICs can include a gate pad located at a corner. An outer high-side MOSFET among the plurality of high-side MOSFETs can be arranged such that a position of the gate pad of the outer high-side MOSFET is in proximity to the driver IC chip.

In one embodiment, a device for driving a motor is generally described. The semiconductor device can include a controller, a motor, and a hybrid integrated circuit (IC). The hybrid IC can include a driver IC connected to the controller through input pins of the hybrid IC. The hybrid IC can further include a first IC and a plurality of second ICs. The first IC can be arranged along one side of the driver IC in plan view. The first IC can include a plurality of high-side metal-oxide-semiconductor field-effect transistors (MOSFETs). The first IC can further include a common drain terminal connected to drains of the plurality of high-side MOSFETs. Each one of the plurality of second ICs can include a respective low-side MOSFET. The hybrid IC can further include a first set of bonding wires connecting the driver IC to the first IC. The hybrid IC can further include a second set of bonding wires connecting the driver IC to the plurality of second ICs. The hybrid IC can further include a third set of bonding wires connecting the first IC to the plurality of second ICs. The hybrid IC can further include a fourth set of bonding wires connecting the plurality of second ICs to the motor through output pins of the hybrid IC. Each one of the plurality of high-side MOSFETs and low-side MOSFETs among the plurality of second ICs can include a gate pad located at a corner. An outer high-side MOSFET among the plurality of high-side MOSFETs can be arranged such that a position of the gate pad of the outer high-side MOSFET is in proximity to the driver IC chip.

In one embodiment, a hybrid integrated circuit (IC) implementing a motor driver is generally described. The hybrid IC can include a driver IC, a plurality of high-side metal-oxide-semiconductor field-effect transistors (MOSFETs) integrated in a first IC separated from the driver IC, and a plurality of low-side MOSFETs. The first IC can be arranged along one side of the driver IC in plan view. Drains of the plurality of high-side MOSFETs can be connected at a common drain terminal of the first IC. Each one of the high-side MOSFETs can include a gate pad located at a corner of a corresponding high-side MOSFET. Each one of the low-side MOSFETs is integrated in an individual second IC separated from the driver IC and the first IC. Each one of the low-side MOSFETs can include a gate pad located at a corner of a corresponding low-side MOSFET. A first set of bonding wires can connect the driver IC to the gate pads of the plurality of high-side MOSFETs. A second set of bonding wires can connect the driver IC to the gate pads of the plurality of low-side MOSFETs. A third set of bonding wires can connect the plurality of high-side MOSFETs to the plurality of low-side MOSFETs. Each one of the plurality of high-side MOSFETs and low-side MOSFETs among the plurality of second ICs can include a gate pad located at a corner. An outer high-side MOSFET among the plurality of high-side MOSFETs can be arranged such that a position of the gate pad of the outer high-side MOSFET is in proximity to the driver IC chip.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
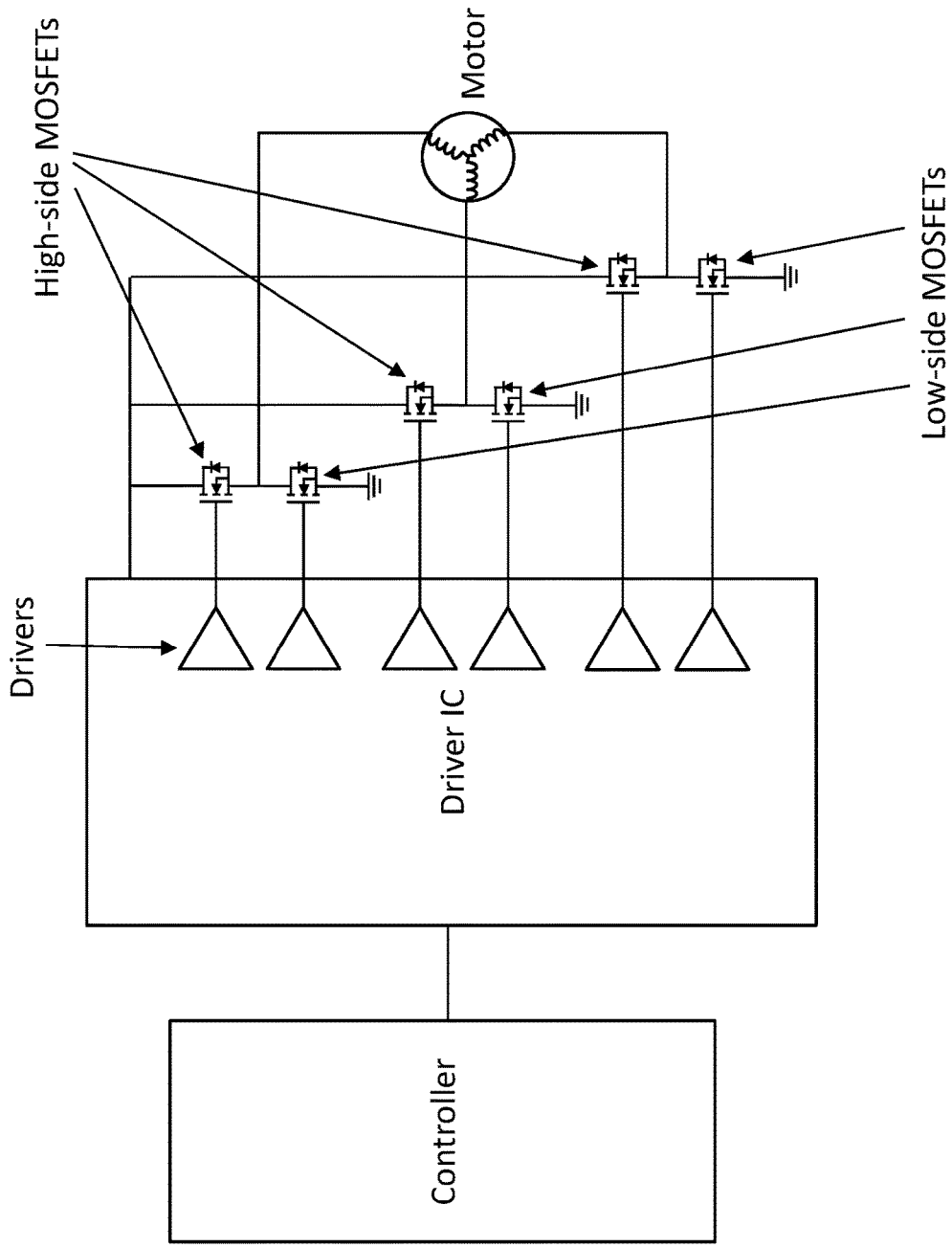
FIG. 1A is a diagram showing a system including a conventional three-phase motor driver.

FIG. 1A is a diagram showing a system including a conventional three-phase motor driver. The system shown in FIG. 1A includes a controller, a driver integrated circuit (IC), a plurality of high-side metal-oxide-semiconductor field-effect transistors (MOSEFTs), a plurality of low-side MOSFETs, and a motor. The driver IC can include a plurality of drivers. Each driver can receive control signals (e.g., pulse width modulation (PWM)) from the controller and drive a MOSFET among high-side MOSFETs and low-side MOSFETs. Each high-side MOSFET can be connected to a low-side MOSFET to form a pair of power transistors. Hence, the system shown in FIG. 1A has three pairs of power transistors. The motor includes three coils. Each coil in the motor is connected to one pair of power transistors.

The driver IC can be a conventional three-phase motor driver, such as brushless direct current (BLDC) model driver. As the drivers in driver IC switches the three pairs of power transistors, the three pairs of power transistors can provide different phase current to the coils of the motor. The phase current being provided to the coils can produce magnetic fields to move the motor. The total phase current being provided to the three coils will have a sum of zero. The different phase current provided to the three coils can produce different magnetic fields, and the different magnetic fields can control direction and speed of the motor.

Applications that can utilize a BLDC model driver shown in FIG. 1A can be application that require relatively small components. Such applications can include, for example, drones, cleaning robots, electronic gardening tools, warehouse robots, medical assistance robots, toys, camera lens, various industrial and consumer products.

To drive low voltage devices, such as camera lens, drain-source on resistance (RDSON) needs to be minimized because low voltage devices need high current. Low impedance wiring, such as aluminum bonding, can be used, to reduce RDSON. On the other hand, to drive high voltage devices, such as drones or cleaning robots, the increased RDSON contributed by wires can be acceptable because high voltage devices can operate with low current.

In the system in FIG. 1A, the high-side MOSFETs and the low-side MOSFETs are external to the conventional three-phase motor driver (e.g., the driver IC). The location of the high-side MOSFETs and the low-side MOSFETs being external to the driver IC can require more circuit board space and more wires for connecting the driver IC to the MOSFETs. The wires can contribute to an increase of RDSON of the high-side MOSFETs and the low-side MOSFETs.

Figure 1B:
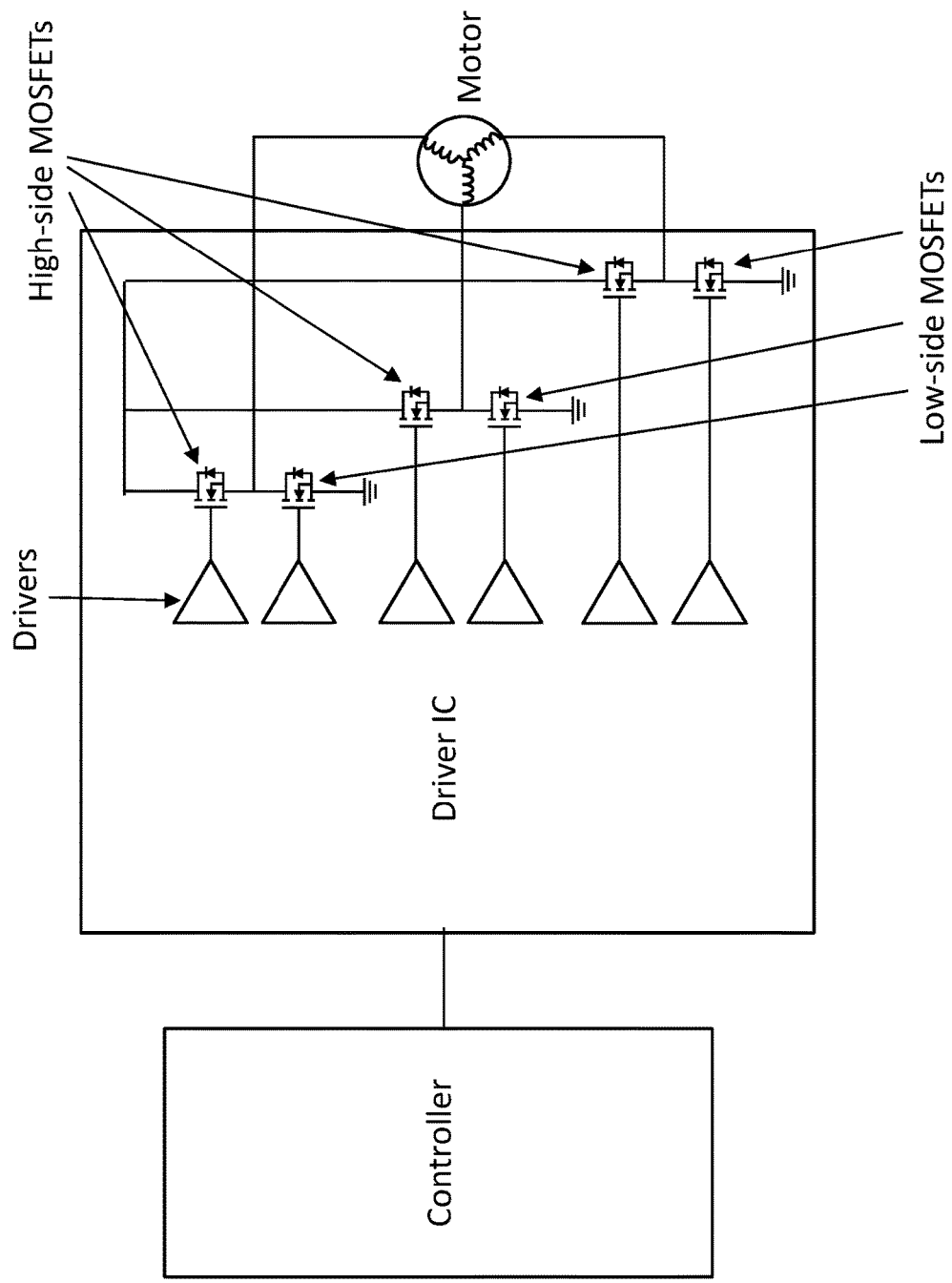
FIG. 1B is a diagram showing another system including another conventional three-phase motor driver.

FIG. 1B is a diagram showing another system including another conventional three-phase motor driver. In the system shown in FIG. 1B, the drivers and other circuit components of the driver IC, the high-side MOSFETs and the low-side MOSFETs are manufactured on the same piece of wafer (e.g., silicon). Hence, the driver IC in FIG. 1B is a monolithic IC including the high-side MOSFETs and the low-side MOSFETs. This monolithic IC configuration can reduce wiring and preserve circuit board space. However, monolithic ICs cannot handle high voltage since power needs to consume on one die, thus driving capability is limited. Monolithic IC such as the driver IC shown in FIG. 1B can be suitable for low voltage applications, or applications that do not require high voltage, such as cell phone cameras or small motors, but can be insufficient for higher voltage applications such as drones and cleaning robots.

Figure 2:
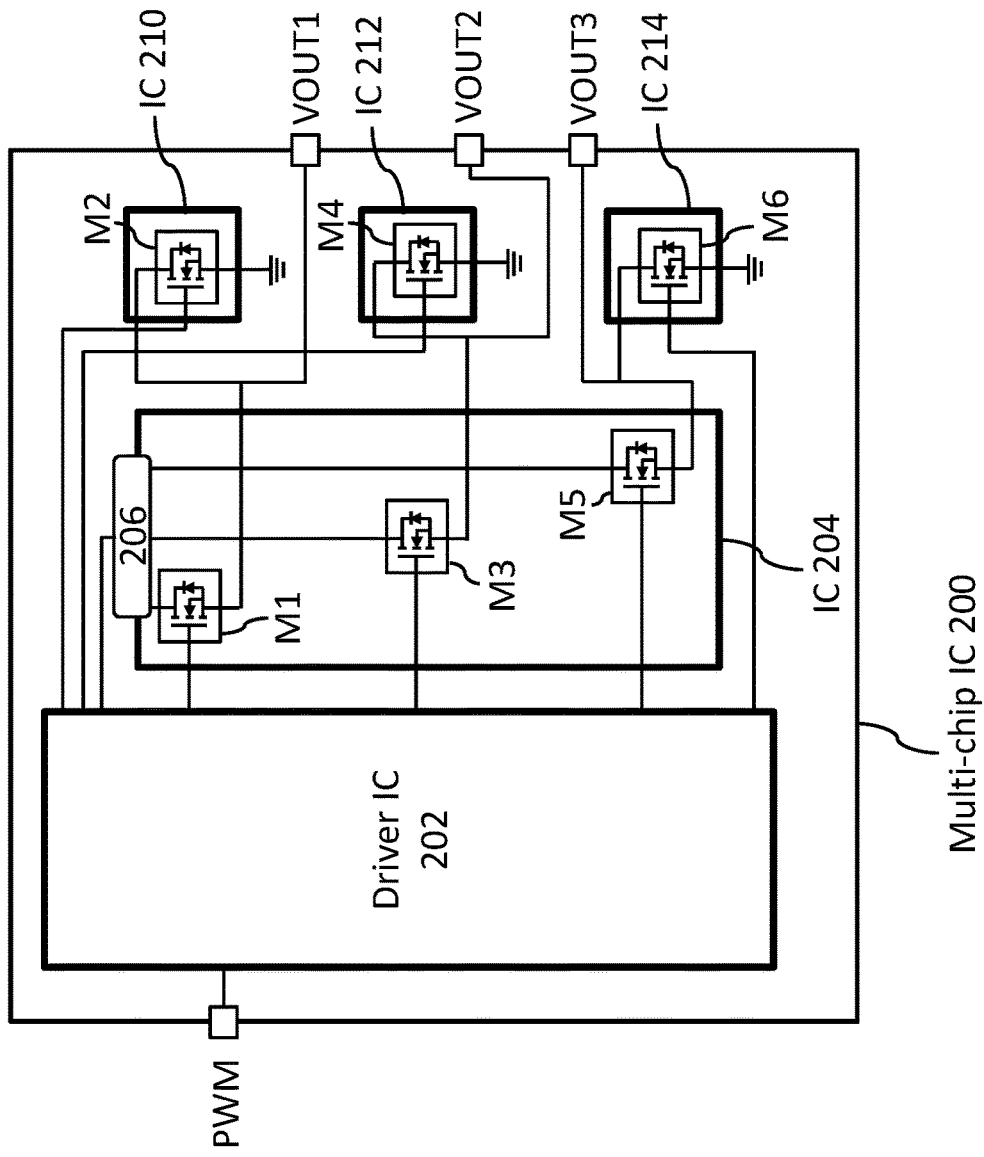
FIG. 2 is a diagram of a three-phase motor driver with built-in discrete MOSEFTs in one embodiment.

FIG. 2 is a diagram of a three-phase motor driver with built-in discrete MOSEFTs in one embodiment. In an embodiment shown in FIG. 2, a three-phase motor driver with built-in discrete MOSFETs can be implemented by a hybrid IC 200. Hybrid IC 200 can be an electronic package including multiple ICs (or die), individual devices such as semiconductor devices (e.g., transistors, diodes or monolithic ICs) and/or passive components (e.g., resistors, inductors, transformers, and capacitors), bonded to a substrate or printed circuit board (PCB) and assembled into a single device. Hybrid IC 200 can function as a single component and can be mounted on a substrate, where the bare dies of the substrate can be connected to the surface via wire bonding, tape bonding or flip-chip bonding. Hybrid IC 200 can be encapsulated by, for example, a plastic molding and can be mounted on a printed circuit board.

Hybrid IC 200 can include a driver IC or die 202, and a plurality of ICs, or die, 204, 210, 212, 214. ICs 204, 210, 212, 214 can be individual or discrete ICs. IC 204 can be a high-side IC including a plurality of high-side MOSFETs. Each one of IC 210, 212, 214 can include one low-side MOSFET. In the embodiment shown in FIG. 2, IC 204 can include three high-side MOSFETs M1, M3, M5. IC 204 can further include a common drain terminal 206 connected to the drains of high-side MOSFETs M1, M3, M5. Common drain terminal 206 can be connected to, for example, an input voltage source in driver IC 202 such that input voltage can be provided to the high-side MOSFETs in IC 204 via common drain terminal 206.

ICs 210, 212, 214 can include a low-side MOSFET M2, a low-side MOSFET M4, and a low-side MOSFET M6, respectively. Driver IC 202 can be connected to gate pads of high-side MOSFETs M1, M3, M5 in IC 204 using a first set of bonding wires. Driver IC 212 can also be connected to gate pads of low-side MOSFETs M2, M4, M6 of ICs 210, 212, 214, respectively, using a second set of bonding wires. IC 204 can be connected to ICs 210, 212, 214 using a third set of bonding wires. The first, second, third set of bonding wires can be, for example, gold palladium copper (AuPdCu) bonding wires.

Hybrid IC 200 can include a plurality of input pins and output pins to connect to different components. In the embodiment shown in FIG. 2, hybrid IC 200 can include an input pin PWM that can be connected to, for example, a controller such that the connected controller can provide PWM control signals to driver IC 202 via the PWM pin. Hybrid IC 200 can also include output pins such as VOUT1, VOUT2, VOUT3 that can be connected to, for example, different coils of a motor such that MOSFETs in ICs 204, 210, 212, 214 being driven by driver IC 202 can provide current to the connected coils in order to drive the motor.

By having the high-side MOSFETs as one discrete built-in IC, and the low-side MOSFETs as three discrete built-in ICs, with driver IC 202, hybrid IC 200 can have less wiring when compared to conventional systems that has the MOSFETs external to the driver IC (e.g., FIG. 1A) while being able to support higher voltage applications when compared to monolithic solutions (e.g., FIG. 1B).

Figure 3:
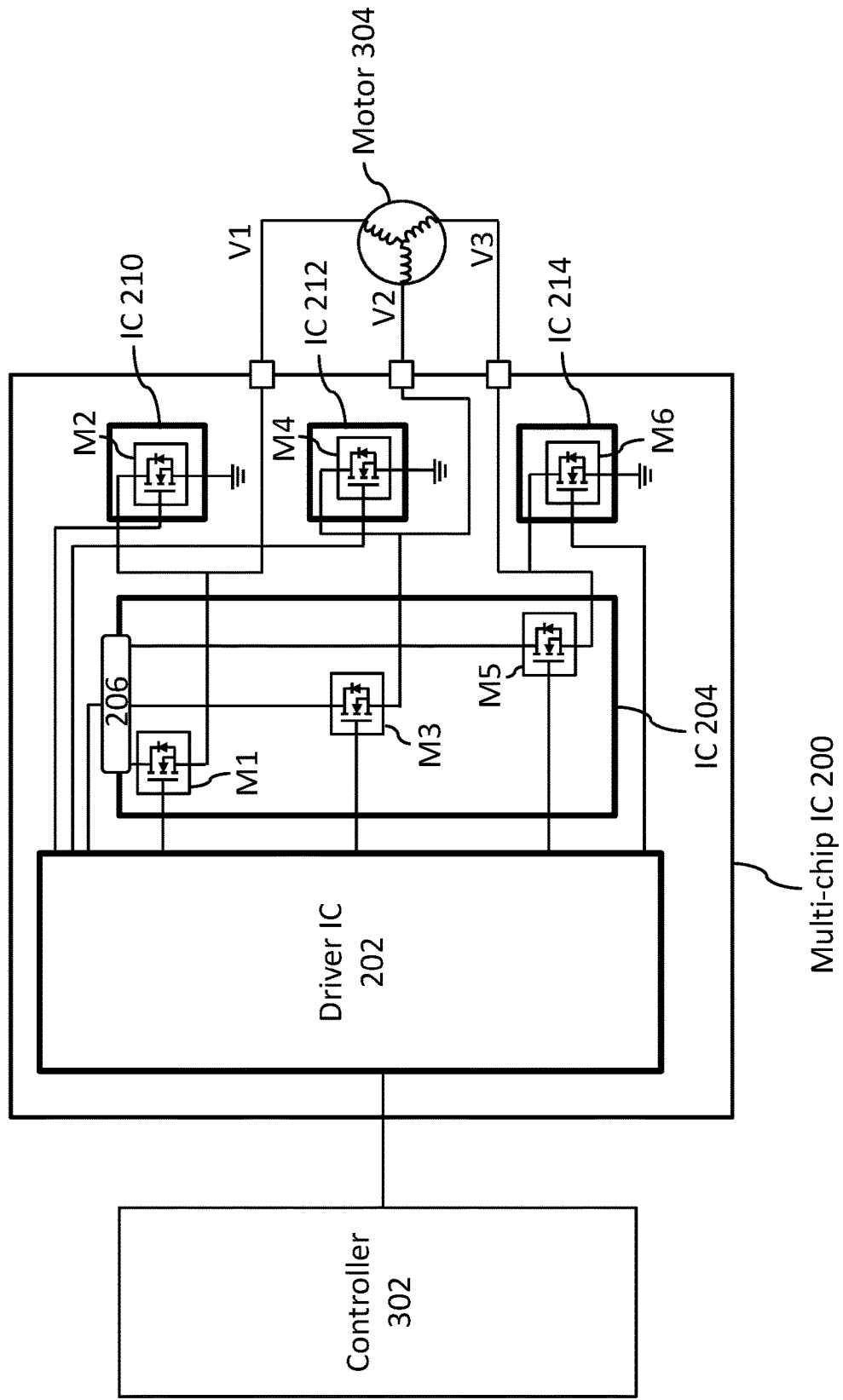
FIG. 3 is a diagram of a system that utilizes a three-phase motor driver with built-in discrete MOSEFTs in one embodiment.

FIG. 3 is a diagram of a system that utilizes a three-phase motor driver with built-in discrete MOSEFTs in one embodiment. The system in FIG. 3 can include a controller 302, hybrid IC 200, and a motor 304. Hybrid IC 200 can receive control signals (e.g., pulse width modulation (PWM) signals) from controller 302 to drive a MOSFETs M1, M2, M3, M4, M5, M6 in ICs 204, 210, 212, 214. MOSFETs M1 and M2 can form a first pair of power transistors, MOSFETs M3 and M4 can form a second pair of power transistors, MOSFETs M5 and M6 can form a third pair of power transistors. The first, second, third pair of power transistors can be switched by driver IC 202, using the PWM signals provided by controller 302, to generate output voltages V1, V2, V3, respectively. Referring to FIG. 2, voltages V1, V2, V3 can be outputted from pins VOUT1, VOUT2, VOUT3, of hybrid IC 200, respectively.

Motor 304 can include three coils connected to the three pairs of power transistors formed by MOSFETs M1, M2, M3, M4, M5, M6. Hybrid IC 200 can function as a three-phase motor driver, such as brushless direct current (BLDC) model driver. As the three pairs of power transistors in hybrid IC 200 are being switched by driver IC 202, phase current of voltages V1, V2. V3 can be provided to the three coils of motor 304. The phase currents being provided to the coils can produce magnetic fields to operate or move motor 304. The total phase current being provided to the three coils can have a sum of zero. The different phase current provided to the three coils can produce different magnetic fields, and the different magnetic fields can control direction and speed of the motor.

Figure 4:
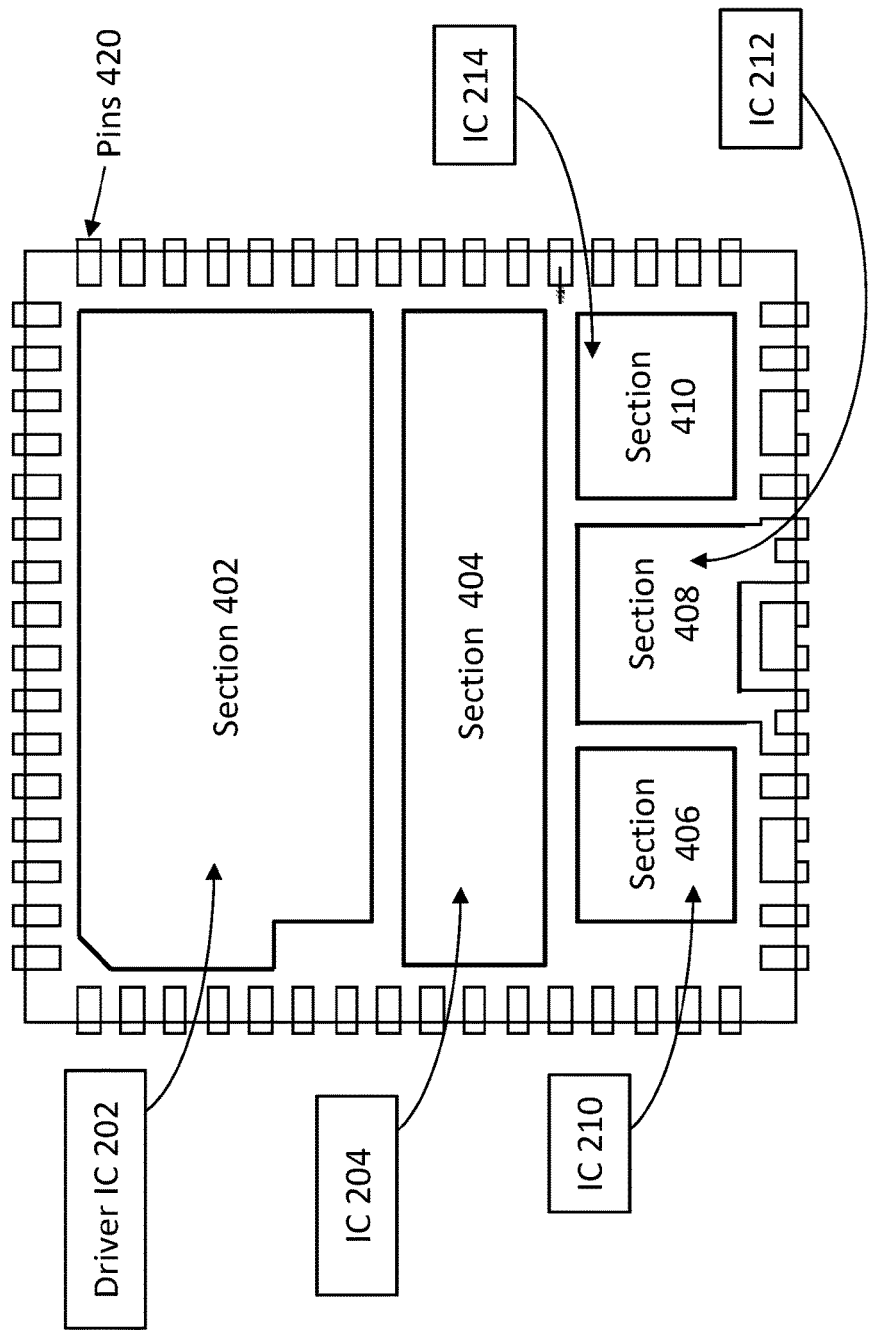
FIG. 4 is a diagram of a circuit board for forming a three-phase motor driver with built-in discrete MOSEFTs in one embodiment.

FIG. 4 is a diagram of a circuit board for forming a three-phase motor driver with built-in discrete MOSEFTs in one embodiment. A circuit board 400 can be used for forming hybrid IC 200 shown in FIG. 2 and FIG. 3. Circuit board 400 can include sections 402, 404, 406, 408, 410 and a plurality of pins 420. The plurality of pins 420 can include input pins and output pins, such as pins PWM, VOUT1, VOUT2, VOUT3 shown in FIG. 2. Section 402 can be reserved for driver IC 202, section 404 can be reserved for IC 204, and sections 406, 408, 410 can be reserved for ICs 210, 212, 214, respectively.

To form hybrid IC 200, driver IC 202 can be mounted in section 402 of circuit board 400. ICs 204, 210, 212, 214 can be mounted in sections 404, 406, 408, 410, of circuit board 400, respectively. In response to mounting driver IC 202 and ICs 204, 210, 212, 214, bonding wires can be added to interconnect driver IC 202 and ICs 204, 210, 212, 214. Other wirings can be added to connect driver IC 202 and ICs 204, 210, 212, 214 to pins 420. In response to completing the wiring, the resulting package can be encapsulated by, for example, plastic molding, to form a single electronic package.

Figure 5:
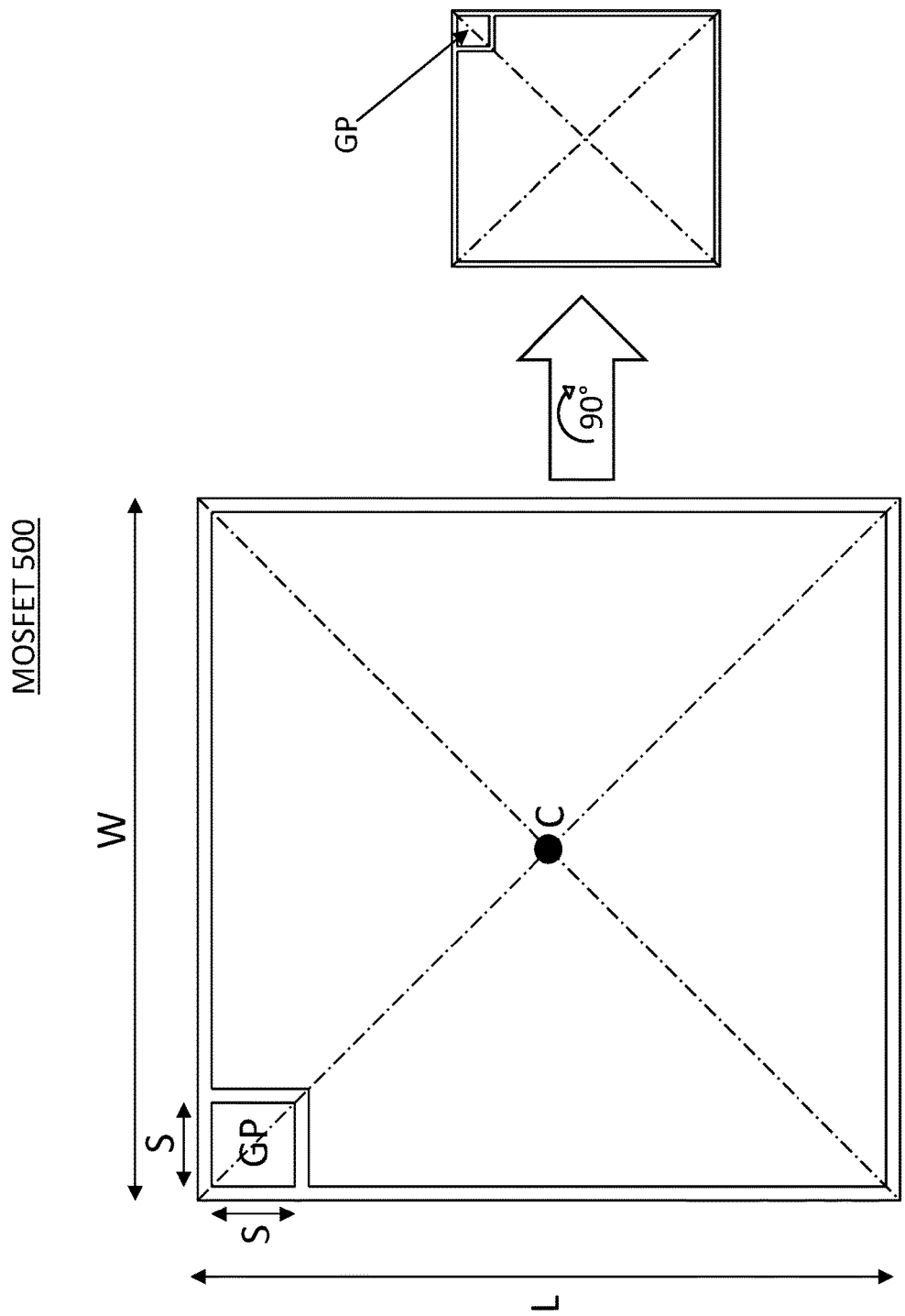
FIG. 5 is a plan view of a MOSFET in a three-phase motor driver with built-in discrete MOSEFTs in one embodiment.

FIG. 5 is a plan view of a MOSFET in a three-phase motor driver with built-in discrete MOSEFTs in one embodiment. A plan view of a MOSFET 500 is shown in FIG. 5. MOSFET 500 can be used as MOSFETs M1, M2, M3, M4, M5, M6 in FIG. 2 and FIG. 3. MOSFET 500 can have a shape that is a square shape or close to a square shape when viewed from a top perspective, as shown in the plan view in FIG. 5. In one embodiment, a lateral aspect ratio (e.g., ratio between length L and width W of MOSFET 500) can be less than 1.2. Note that when the lateral aspect ratio is 1.0, MOSFET 500 W=L and MOSFET 500 has a square shape. A gate pad GP can be located in one of four corners of MOSFET 500. Gate pad GP can also be a square shape. The length of the sides of gate pad GP is denoted as S. In one embodiment, W and L can be approximately 1,400 micrometers (μm) and S can be approximately 200 μm.

In one embodiment, since MOSFET 500 is square shape, a rotation of MOSFET 500 can cause gate pad GP to be moved to another corner without impacting the overall shape and orientation of MOSFET 500. In an example shown in FIG. 5, if MOSFET 500 is rotated clockwise by 90-degrees, or counterclockwise by 90 degrees, around a center point C, gate pad GP can be moved to another corner MOSFET 500 can still retain its square shape, and a location of MOSFET 500 can remain unchanged. Referring to FIG. 4, MOSFET 500 can be mounted in sections 406, 408, 410 even after being rotated 90-degrees because the area being occupied by the rotated MOSFET 500 in the sections will remain the same. Further, after the rotation, the distance between gate pad GP and IC 204 and/or driver IC 202 is approximately the same as well. Therefore, using a square MOSFET, such as MOSFET 500, can provide flexibility to locations of bonding wires used for interconnecting ICs in hybrid IC 200 and reduce collision among the bonding wires.

Figure 6:
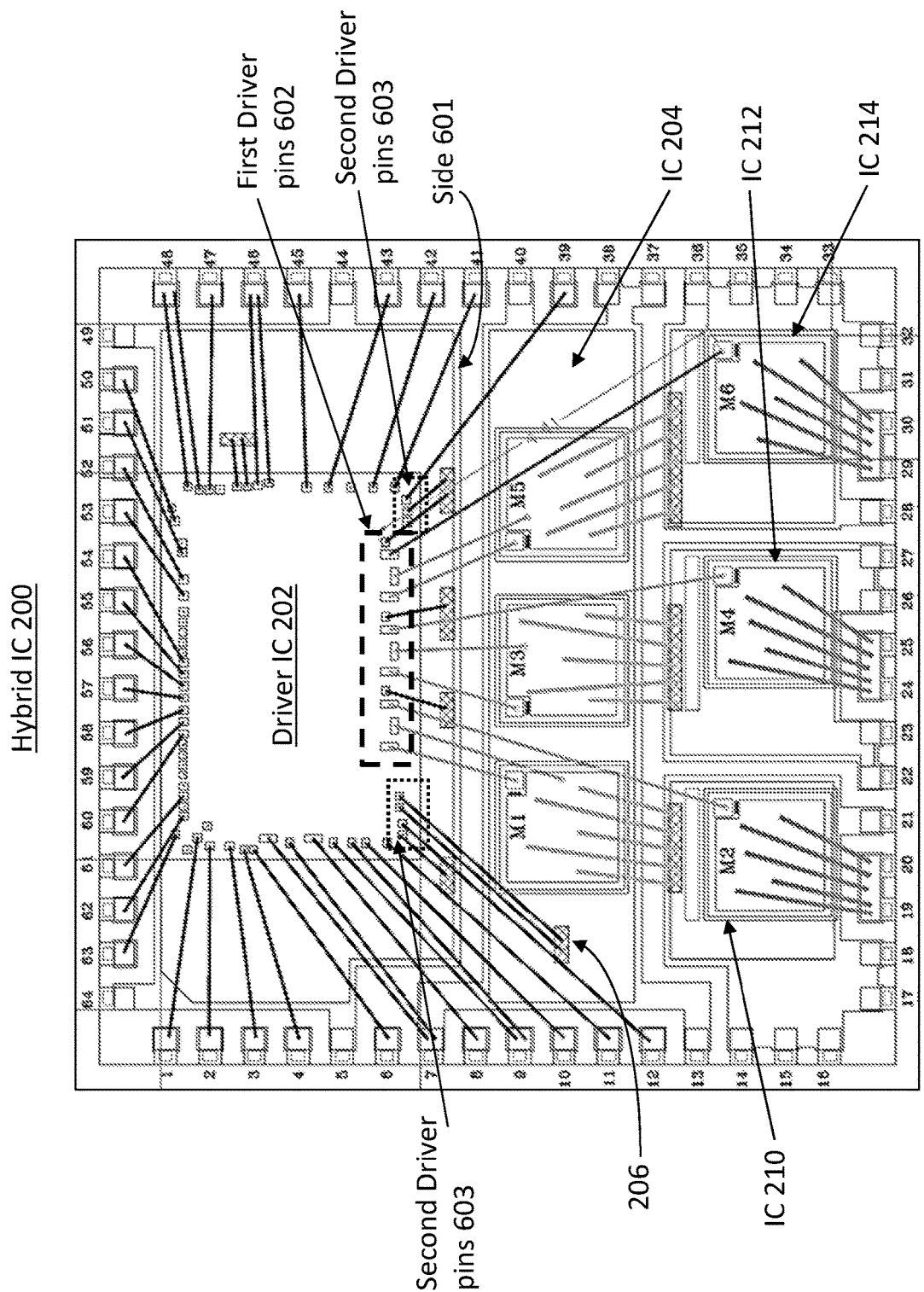
FIG. 6 is a bonding diagram of a three-phase motor driver with built-in discrete MOSEFTs in one embodiment.

FIG. 6 is a bonding diagram of a three-phase motor driver with built-in discrete MOSEFTs in one embodiment. A bonding diagram showing a plan view of hybrid IC 200 is shown in FIG. 6. As shown in FIG. 6, driver IC 202 and ICs 204, 210, 212, 214 are mounted on respective sections of circuit board 400 of FIG. 4. IC 204 includes the high-side MOSFETs M1, M3, M5 and common drain terminal 206. IC 204 can be arranged along one side of driver IC 202, such as being arranged in parallel with a side 601 of driver IC 202. ICs 210, 212, 214 include MOSFETs M2, M4, M6, respectively. Focusing on IC 204, high-side MOSFETs M1 and M5 can be considered as outer high-side MOSFETs and high-side MOSFET can be considered as a middle high-side MOSFET. Driver IC 202 can include a plurality of driver pins in proximity to a periphery of driver IC 202. A specific set of first driver pins 602 are designed to be located on the side of driver IC 202 that faces ICs 204, 210, 212, 214 in hybrid IC 200. First driver pins 602 can include output pins that connect to gate pads of MOSFETs M1, M2, M3, M4, M5, M6 such that driver IC 202 can drive MOSFETs M1, M2, M3, M4, M5, M6. In one embodiment, first driver pins 602 can include input and output pins that allow driver IC 202 to communicate and exchange signals with MOSFETs M1, M2, M3, M4, M5, M6. A specific set of second driver pins 603 are designed to be located close to a corners of driver IC 202 such that second driver pins 603 can be connected to drain terminal 206 and pins on the periphery of hybrid IC 200, or the like. Wires can be used for connecting second driver pins 603 to pins on the periphery of the hybrid IC 200, and for connecting gate pads of MOSFETs M1 to M6 to first driver pins 602. The flexibility to rotate MOSFETs M1 to M6 and the alignment of at least one of the outer high-side MOSFETs to position gate pads closer to driver IC 202 can avoid potential collision between wires connected to first driver pins 602 and second driver pins 603.

Each one of MOSFETs M1, M2, M3, M4, M5, M6 has a square shape (see MOSFET 500 in FIG. 5). In the example shown in FIG. 6, the gate pads MOSFETs M1, M2, M4, M6 are located in the upper-right corner and the gate pads of MOSFETs M3, M5 are located in the upper-left corner. The MOSFETs M1, M2, M3, M4, M5, M6 can be rotated to accommodate spacing of the bonding wires. In one embodiment, gate pads of high-side MOSFETs M3 and M5 being located in the upper-left corner can be a result of rotating high-side MOSFETs M3 and M5 from an original arrangement or orientation (e.g., gate pad being in the upper-right corner). The rotation can allow gate pads of high-side MOSFETs M3 and M5 to be in proximity, or relatively closer, to driver IC 202 when compared with arrangements before the rotation. In another embodiment, outer high-side MOSFETs M1 and M5 are rotated or oriented such that their gate pads are located in corners that are in proximity, or relatively closer, to driver IC 202 and further away from edges of hybrid IC 200. In another embodiment, if bonding wires connected to gate pads of MOSFETs M1 and M3 are considered too close to one another, or is at risk of colliding, then MOSFET M3 can be rotated clockwise to move its gate pad from the upper-left corner to the upper-right corner to avoid the potential collision.

Figure 7:
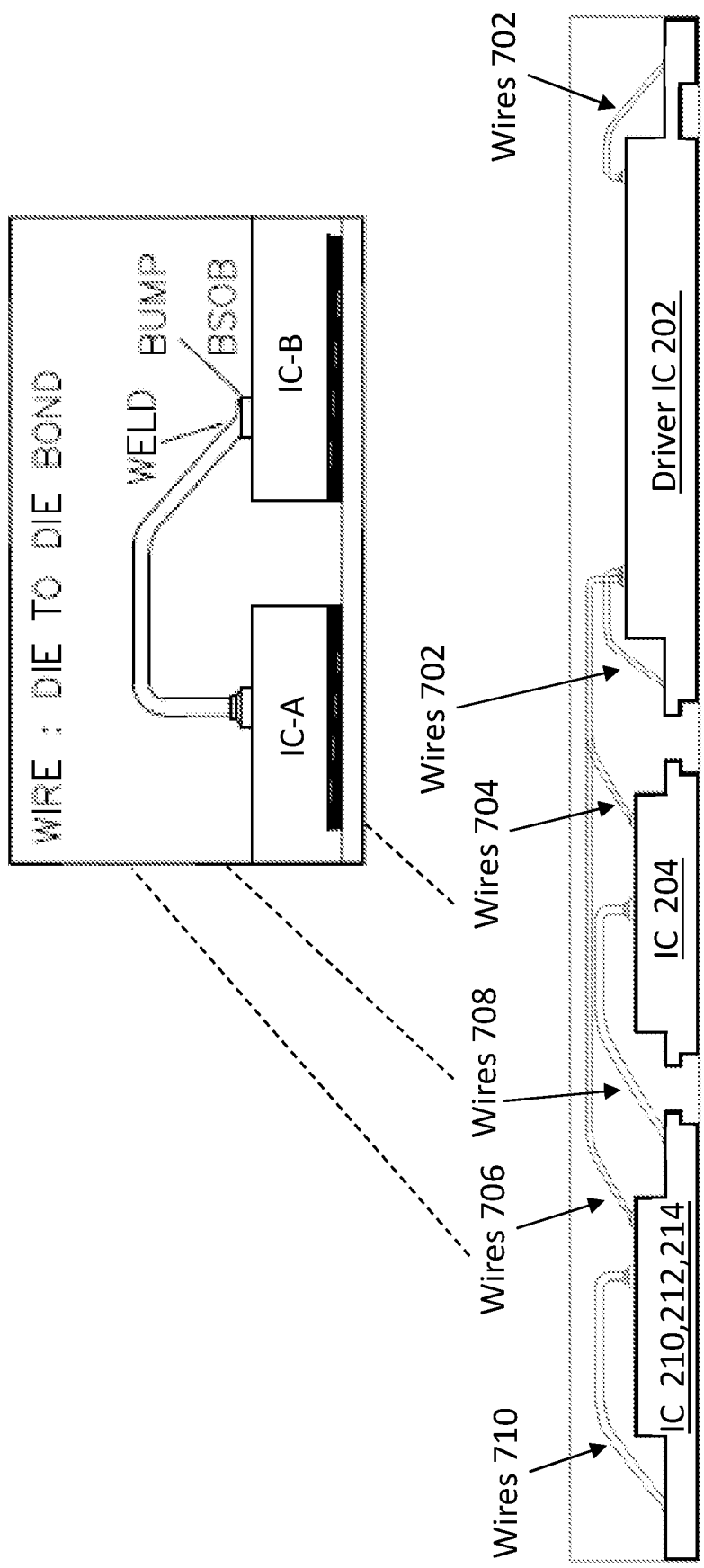
FIG. 7 is a diagram showing a cross-sectional view of a three-phase motor driver with built-in discrete MOSEFTs in one embodiment.

FIG. 7 is a diagram showing a cross-sectional view of a three-phase motor driver with built-in discrete MOSEFTs in one embodiment. The cross-sectional view of hybrid IC 200 shows bonding wires that can be used for interconnecting driver IC 202 and ICs 204, 210, 212, 214. A set of bonding wires 702 can connect driver IC 202 to circuit board 400 and/or pins 420 of circuit board 400 (see FIG. 4). A set of bonding wires 704 can connect driver IC 202 to IC 204. In one embodiment, bonding wires 704 can connect a portion of first driver pins 602 in FIG. 6 to gate pads of MOSFETs M1, M3, M5 of IC 204. A set of bonding wires 706 can connect driver IC 202 to ICs 210, 212, 214. In one embodiment, bonding wires 706 can connect a portion of first driver pins 602 to gate pads of MOSFETs M2, M6, M6 of ICs 210, 212, 214, respectively. A set of bonding wires 708 can connect IC 204 to ICs 210, 212, 214. A set of bonding wires 710 can connect MOSFETs M2, M4, M6 of ICs 210, 212, 214 to pins 420 of circuit board 400.

In one embodiment, bonding wires 704, 706, 708 can interconnect driver IC 202 and ICs 204, 210, 212, 214 using die to die bonding such as ball stitch on ball (BSOB) bonding. In an example is shown in FIG. 7, to interconnect two dies IC-A and IC-B, a stud ball bump can be formed on a bond pad on IC-B, a wire attached to IC-A can be welded between the stud ball bump on IC-B and another a ball bond on top welded on top of the wire to interconnect IC-A to IC-B.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A hybrid integrated circuit (IC) comprising:
    a driver IC;
    a first IC arranged along one side of the driver IC in plan view and including:
        a plurality of high-side metal-oxide-semiconductor field-effect transistors (MOSFETs);
        a common drain terminal connected to drains of the plurality of high-side MOSFETS;
    a plurality of second ICs, wherein each second IC includes a respective low-side MOSFET;
    a first set of bonding wires connecting the driver IC to the first IC; and
    a second set of bonding wires connecting the driver IC to the plurality of second ICs, wherein:
        each one of the plurality of high-side MOSFETs and low-side MOSFETs among the plurality of second ICs include a gate pad located at a corner; and
        an outer high-side MOSFET among the plurality of high-side MOSFETs is arranged such that a position of the gate pad of the outer high-side MOSFET is in proximity to the driver IC chip.

2. The hybrid IC of claim 1, wherein the plurality of high-side MOSFETs include two outer high-side side MOSFETs and a middle high-side MOSFET, and the two outer high-side MOSFETs are arranged such that their respective gate pads are in proximity to the driver IC chip.

3. The hybrid IC of claim 1, further comprising a third set of bonding wires connecting the first IC to the plurality of second ICs.

4. The hybrid IC of claim 3, wherein:
    the first IC includes a first high-side MOSFET, a second high-side MOSFET, and a third high-side MOSFET;
    the plurality of second ICs include a first MOSFET IC, a second MOSFET IC and a third MOSFET IC;
    the first, second and third MOSFET ICs include a first low-side MOSFET, a second low-side MOSFET and a third low-side MOSFET, respectively; and
    the third set of bonding wires connects the first, second and third high-side MOSFETs to the first, second and third low-side MOSFETs, respectively.

5. The hybrid IC of claim 1, wherein:
    the plurality of high-side MOSFETs and low-side MOSFETs among the plurality of second ICs have a square shape;
    the first set of bonding wires connects the driver IC to gate pads of the plurality of high-side MOSFETs; and
    the second set of bonding wires connects the driver IC to gate pads of the low-side MOSFETs among the plurality of second ICs.

6. The hybrid IC of claim 1, wherein the first IC is situated between the driver IC and the plurality of second ICs.

7. A device comprising:
    a controller;
    a motor;
    a hybrid integrated circuit (IC) comprising:
        a driver IC connected to the controller through input pins of the hybrid IC;
        a first IC arranged along one side of the driver IC in plan view and including:
            a plurality of high-side metal-oxide-semiconductor field-effect transistors (MOSFETs);
            a common drain terminal connected to drains of the plurality of high-side MOSFETs;
        a plurality of second ICs, wherein each second IC includes a respective low-side MOSFET;
        a first set of bonding wires connecting the driver IC to the first IC;
        a second set of bonding wires connecting the driver IC to the plurality of second ICs, wherein:
            each one of the plurality of high-side MOSFETs and low-side MOSFETs among the plurality of second ICs include a gate pad located at a corner; and an outer high-side MOSFET among the plurality of high-side MOSFETs is arranged such that a position of the gate pad of the outer high-side MOSFET is in proximity to the driver IC chip.

8. The device of claim 7, wherein the plurality of high-side MOSFETs include two outer high-side side MOSFETs and a middle high-side MOSFET, and the two outer high-side MOSFETs are arranged such that their respective gate pads are in proximity to the driver IC chip.

9. The device of claim 7, further comprising
a third set of bonding wires connecting the first IC to the plurality of second ICs; and
a fourth set of bonding wires connecting the plurality of second ICs to the motor through output pins of the hybrid IC.

10. The device of claim 9, wherein:
the first IC includes a first high-side MOSFET, a second high-side MOSFET, and a third high-side MOSFET;
the plurality of second ICs include a first MOSFET IC, a second MOSFET IC and a third MOSFET IC;
the first, second and third MOSFET ICs include a first low-side MOSFET, a second low-side MOSFET and a third low-side MOSFET, respectively; and
the third set of bonding wires connects the first, second and third high-side MOSFETs to the first, second and third low-side MOSFETs, respectively.

11. The device of claim 10, wherein:
the motor includes a first coil, a second coil, and a third coil; and
the fourth set of bonding wires connects the first, second and third low-side MOSFETs to the first, second and third coils, respectively.

12. The device of claim 7, wherein:
the plurality of high-side MOSFETs and low-side MOSFETs among the plurality of second ICs have a square shape;
the first set of bonding wires connects the driver IC to gate pads of the plurality of high-side MOSFETs; and
the second set of bonding wires connects the driver IC to gate pads of the low-side MOSFETs among the plurality of second ICs.

13. The device of claim 7, wherein the first IC is situated between the driver IC and the plurality of second ICs.

14. The device of claim 7, wherein the hybrid IC receives an input voltage at the common drain terminal.

15. A hybrid integrated circuit (IC) comprising:
a driver IC;
a plurality of high-side metal-oxide-semiconductor field-effect transistors (MOSFETs) integrated in a first IC separated from the driver IC, the first IC being arranged along one side of the driver IC in plan view, wherein:
drains of the plurality of high-side MOSFETs are connected at a common drain terminal of the first IC;
each one of the high-side MOSFETs include a gate pad located at a corner of a corresponding high-side MOSFET;
a plurality of low-side MOSFETs, wherein:
each one of the low-side MOSFETs is integrated in an individual second IC separated from the driver IC and the first IC;
each one of the low-side MOSFETs include a gate pad located at a corner of a corresponding low-side MOSFET;
a first set of bonding wires connecting the driver IC to the gate pads of the plurality of high-side MOSFETS;
a second set of bonding wires connecting the driver IC to the gate pads of the plurality of low-side MOSFETs, wherein:
each one of the plurality of high-side MOSFETs and low-side MOSFETs among the plurality of second ICs include a gate pad located at a corner; and
an outer high-side MOSFET among the plurality of high-side MOSFETs is arranged such that a position of the gate pad of the outer high-side MOSFET is in proximity to the driver IC chip.

16. The device of claim 15, wherein the plurality of high-side MOSFETs include two outer high-side side MOSFETs and a middle high-side MOSFET, and the two outer high-side MOSFETs are arranged such that their respective gate pads are in proximity to the driver IC chip.

17. The hybrid IC of claim 15, wherein:
each one of the plurality of high-side MOSFETs has a lateral aspect ratio of less than 1.2; and
each one of the plurality of low-side MOSFETs has a lateral aspect ratio of less than 1.2.

18. The hybrid IC of claim 15, wherein:
each one of the plurality of high-side MOSFETs has a square shape; and
each one of the plurality of low-side MOSFETs has a square shape.

19. The hybrid IC of claim 15, wherein a location of each one of the plurality of high-side MOSFETs and the plurality of low-side MOSFETs on the hybrid IC remains unchanged in response to at least one of the plurality of high-side MOSFETs and the plurality of low-side MOSFETs being rotated at one of 90 degrees and 90 degrees.

20. The hybrid IC of claim 15, wherein:
the plurality of high-side MOSFETs includes a first high-side MOSFET, a second high-side MOSFET, and a third high-side MOSFET; and
the plurality of low-side MOSFETs include a first MOSFET IC, a second MOSFET IC and a third MOSFET IC.

* * * * *